United States Patent
Chen et al.

(10) Patent No.: US 7,490,273 B2
(45) Date of Patent: Feb. 10, 2009

(54) AUTO-CALIBRATION METHOD FOR DELAY CIRCUIT

(75) Inventors: Lin Shu Chen, Hsinchu (TW); Sou Pin Chen, Taichung (TW)

(73) Assignee: Socle Technology Corp., Hsinchu (TW)

( * ) Notice: Subject to any disclaimer, the term of this patent is extended or adjusted under 35 U.S.C. 154(b) by 403 days.

(21) Appl. No.: 10/986,030

(22) Filed: Nov. 12, 2004

(65) Prior Publication Data

US 2005/0246596 A1    Nov. 3, 2005

(30) Foreign Application Priority Data

Apr. 28, 2004    (TW)    .............................. 93111837 A

(51) Int. Cl.
*G06K 5/04*    (2006.01)
(52) U.S. Cl. ........................ 714/700; 714/726; 714/731; 327/158; 327/277; 360/26
(58) Field of Classification Search ................. 714/700, 714/726, 731; 327/158, 277; 360/26
See application file for complete search history.

(56) References Cited

U.S. PATENT DOCUMENTS

| | | | | | |
|---|---|---|---|---|---|
| 5,123,020 | A | * | 6/1992 | Yoshimura et al. | 714/820 |
| 5,789,969 | A | * | 8/1998 | Davis et al. | 327/276 |
| 6,025,745 | A | * | 2/2000 | Lee et al. | 327/277 |
| 6,794,913 | B1 | * | 9/2004 | Stengel | 327/158 |
| 6,914,492 | B2 | * | 7/2005 | Hui et al. | 331/57 |
| 7,100,067 | B2 | * | 8/2006 | Hansen et al. | 713/500 |

* cited by examiner

*Primary Examiner*—Esaw T Abraham
(74) *Attorney, Agent, or Firm*—Volentine & Whitt, PLLC

(57) ABSTRACT

An auto-calibration method is applied to a delay circuit, which includes a plurality of delay chains. If the number of accumulative errors of a designated delay chain as a current delay path is larger than a threshold value, the delay circuit scans all the delay chains and records their accumulative error numbers during a unit of time; otherwise, the current delay path is maintained. Afterwards, the number of accumulative errors is compared between all the delay chains to find out which one of the delay chains has a minimum accumulative error number, and the delay chain with a minimum accumulative error number is designated as a new current delay path.

10 Claims, 5 Drawing Sheets

AUTO-CALIBRATION METHOD FOR DELAY CIRCUIT

BACKGROUND OF THE INVENTION

1. Field of the Invention

The present invention relates to an auto-calibration method for a delay circuit, and more particularly to a method for dynamically calibrating the delay time of a circuit according to variations in surrounding conditions.

2. Description of the Related Art

Numerous electronic apparatuses employ only one clock signal to synchronize operations between various devices. For example, an electronic apparatus equipped with DRAMs synchronizes the clock time of output signals from DRAMs with that of its system. Consequentially, the clock signals generated from the system control the DRAMs and other active devices together, and synchronous operation and manipulation exist between them.

Because of the occurrence of clock skew, the synchronicity of the operation between the DRAMs and system clock generator is degraded. The clock skew is a delay phenomenon in a general circuit, and is resulted from the delay effect of a clock buffer circuit and a driving circuit or that of a resistance-inductance circuit.

FIG. 1 is a conventional waveform diagram of output data signals from a DDR (double data rate) DRAM. The timing of output data signals is enabled to be on active duty by the rising edge or falling edge of CK and CK#, which are two clock signals opposite in phase. DQ0-DQ7 represent data signals transmitted by data buses. The transmitting paths for these data signals are all different, hence signal skew exist therebetween. That is, the start of the available interval of the data signal DQ0 is the earliest one, and that of the data signal DQ7 is the latest one. By contrast, the end of the available interval of the data signal DQ0 is also the earliest one, and that of the data signal DQ7 is the latest one. Referring to FIG. 1, a data strobe signal DQS is designated as a sampling reference signal of the data signal.

As shown in FIG. 1, $'HP$ is a half period of the clock signal CK; $'DQSQ$ is the interval from the positive edge or the negative edge of the data strobe signal DQS to the end of the available interval on the data signal DQ0; $'QH$ is the interval from the positive edge or the negative edge of the data strobe signal DQS to the end of the available interval on the data signal DQ7; the overlap between the available intervals of DQ0-DQ7 is a data valid window (DVW).

For the sake of accuracy and stability on data access, the positive edge or the negative edge of the data strobe signal DQS is preferably postponed to the center of the data valid window, and therefore a delay circuit 20 capable of adjusting delay time is put forth to satisfy the aforesaid preferable requirement. As shown in FIG. 2, the delay circuit 20 selects one of the delay chains 21-24 as the best delay path through a multiplexer 26 enabled to be on active duty by a tester 25 during the testing stage of an electronic apparatus. After the delay interval between the input terminal and output terminal is tuned to a default value, the delay time is constant, not variable.

Several disadvantages exist in the conventional way of tuning delay time and are to be overcome; for example, the best delay path is necessarily determined before the electronic apparatus with the delay circuit is used, and consequentially dynamical adjustment, depending on practical conditions in use, is unavailable. That is, the adjustment of delay time is not flexibly available under surrounding temperature increase or slice level shift. On the other hand, the best delay paths of all the devices need to be previously selected during their testing stages, hence the cost and cycle time expended in the manufacturing and testing are increased. In conclusion, such devices are not suitable for mass production.

The data valid window of a PC 133 DDR SDRAM module requires a minimum interval not less than 2.625 nsecs. It is necessary to consider skew time (around 0.513 nsec) resulted from the various characteristics of the print circuit board during the minimum data valid window, the setup and hold time (around 0.6 nsec) of the controller, and the strobe placement uncertainty (around 0.4 nsec) of the data strobe signal DQS. Therefore, the residual margin time is merely 0.1 nsec. Because the variation in the strobe placement uncertainty of the data strobe signal DQS can be doubled when surrounding temperature varies from case to case, errors occur frequently in data access.

In summary, a method for dynamically calibrating a delay circuit according to surrounding conditions is an urgent demand for the IC market so that the problems occurring in the high-speed data transmission and access of electronic devices can be resolved.

SUMMARY OF THE INVENTION

The primary objective of the present invention is to provide an auto-calibration method for a delay circuit. The current delay path of a delay circuit is dynamically designated by means of calculating the occurring amounts of the ECCs (error correcting code) and comparing them between these paths whenever the circuit works, hence the probability of error occurrence is very low.

In order to achieve the above-mentioned objectives, the present invention discloses a an auto-calibration method is applied to a delay circuit, which includes a plurality of delay chains. One of the delay chains is previously designated as the delay path where data output from the delay circuit passes through. The accumulative number of errors is continuously detected and counted during a unit of time when the delay circuit is in use. If the number of accumulative errors of the designated delay chain as a current delay path is larger than a threshold value, the delay circuit scans all the delay chains and records their accumulative error numbers during a unit of time; otherwise, the current delay path is maintained. Afterwards, the number of accumulative errors is compared between all the delay chains to find out which one of the delay chains has a minimum accumulative error number, and the delay chain with a minimum accumulative error number is designated as a new current delay path. Then, the number of accumulative errors of the new designated delay path is continuously observed on whether it is larger than the threshold value. The aforesaid steps are performed again according to the observation.

Before the delay circuit starts to work or is reset, it scans all the delay chains and records their accumulative error numbers during a unit of time, and then the delay chain with a minimum accumulative error number is designated as an initial delay path.

When the delay circuit is in use, a user can define a rule that the delay circuit scans all the delay chains and records their accumulative error numbers during a unit of time after it runs for a certain amount of time. Therefore, all the delay chains are periodically scanned no matter when the number of accumulative errors is larger than the threshold value. Of course, the user can define another rule or sequence to automatically scan and calibrate the delay circuit.

BRIEF DESCRIPTION OF THE DRAWINGS

The invention will be described according to the appended drawings in which.

PREFERRED EMBODIMENT OF THE PRESENT INVENTION

Figure 1:
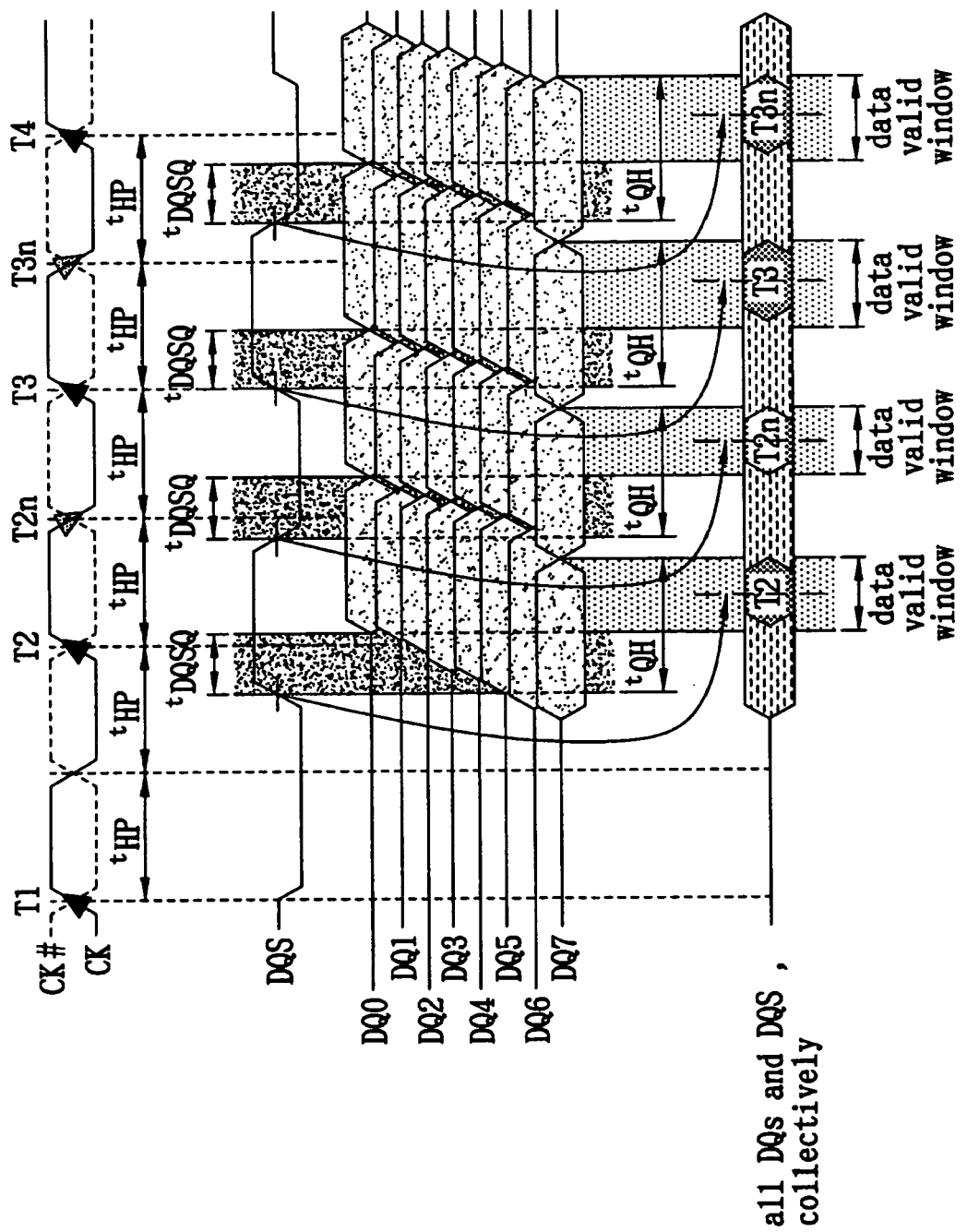
FIG. 1 is a conventional waveform diagram of output data signals from a DDR DRAM.
Figure 2:
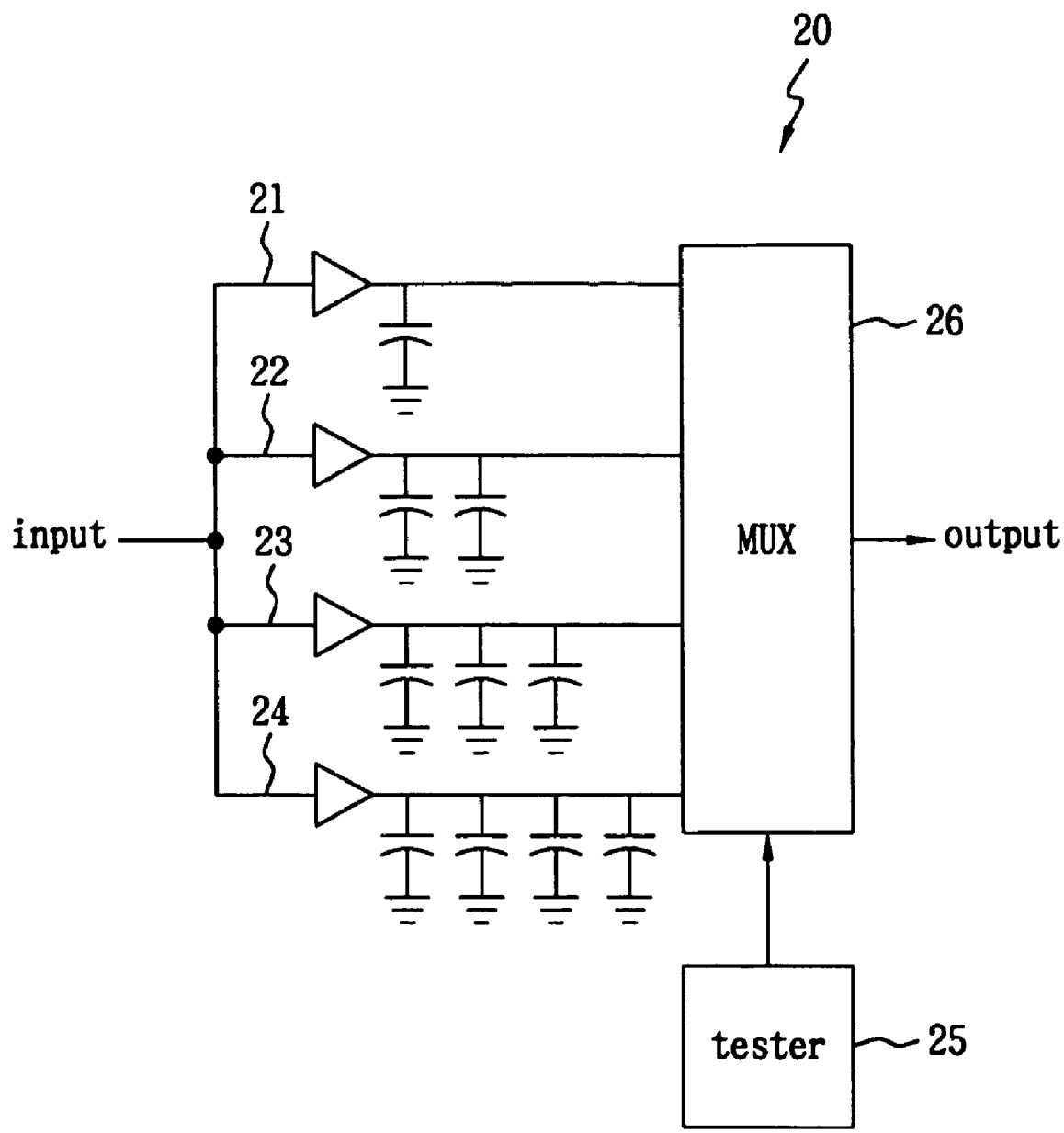
FIG. 2 is a schematic diagram of a conventional delay circuit.
Figure 3:
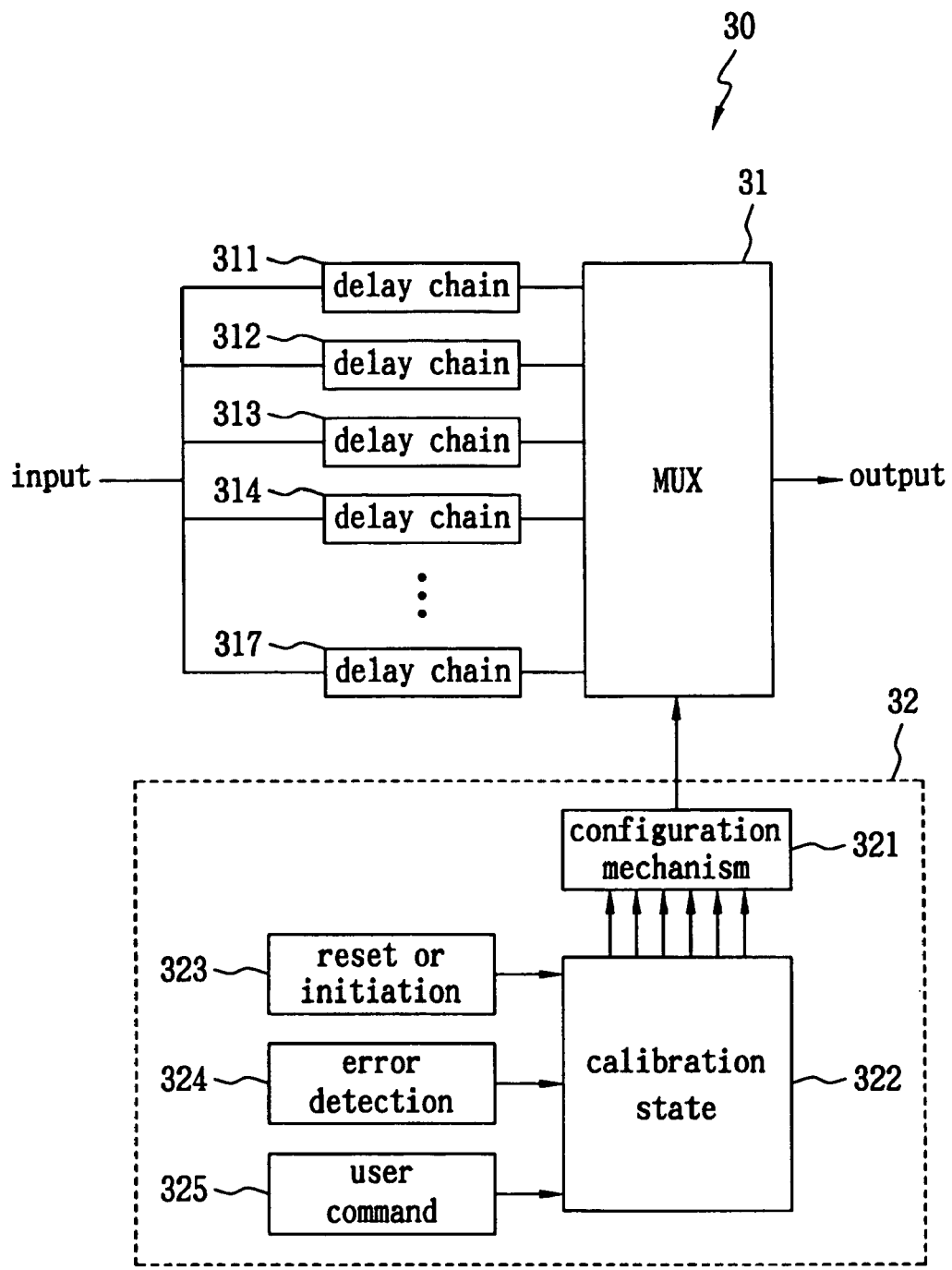
FIG. 3 is a functional block diagram of a delay circuit in accordance with the present invention.
Figure 5A:
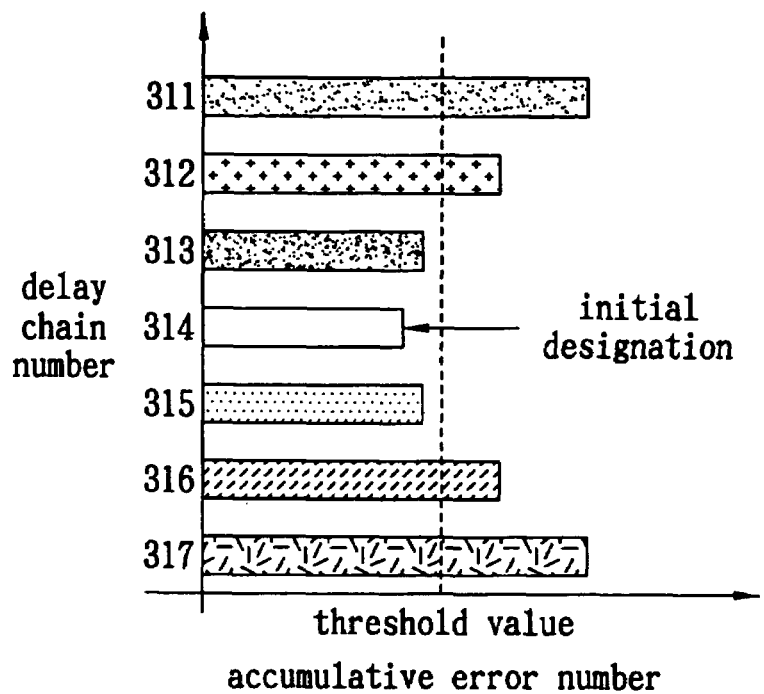
FIGS. 5(a)-5(b) are distribution diagrams of the number of accumulative errors of delay chains in accordance with the present invention.

FIG. 3 is a functional block diagram of a delay circuit in accordance with the present invention. As shown, the delay circuit includes a calibration circuit 32, a multiplexer 31, and a plurality of delay chains 311-317. The delay chains 311-317 are electrically coupled in parallel to an input such that respective delay paths of the delay chains 311-317 are electrically parallel to each other. The delay circuit 30 enables the multiplexer 31 to designate one of delay chains 311-317 as an optimal or current delay path by means of the calibration circuit 32 so as to have a optimal delay time between its input terminal and output terminal. The calibration circuit 32 principally includes a calibration state machine 322. If the delay circuit 30 is in a reset or initiation state 323, the calibration state machine 322 scans all the delay chains 311-317 and records their accumulative error numbers during a unit of time, and designates the delay chain (e.g. the delay chain 314) with a minimum accumulative error number as the delay path for resetting and initializing itself. Afterwards, a configuration mechanism 321 controls the multiplexer 31 and practically designates the delay chain 314 as the delay path of output data, as shown in FIG. 5(a).

Figure 5B:
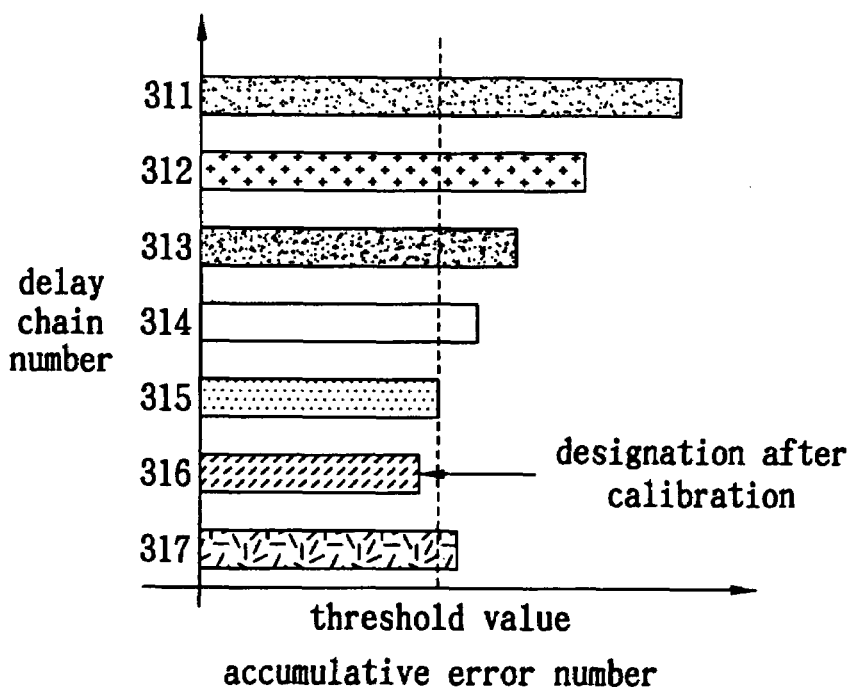

When the delay circuit 30 is still in use, it is in an error detection state 324. That is, the number of accumulative errors, the statistical occurrence amount of ECCs, of the designated delay chain 314 is continuously observed. If the number of accumulative errors during a unit of time is larger than a threshold value, the delay circuit 30 scans all the delay chains 311-317 and records their accumulative error numbers within a unit of time; otherwise the designated delay chain 314 still acts as the current delay path. Afterwards, the number of accumulative errors is compared between all the delay chains 311-317 to find out which one of the delay chains has a minimum accumulative error number within a unit of time, for example, the delay chain 316, and the delay chain 316 with a minimum accumulative error number is designated as the new optimal delay path of the delay circuit 30 by means of the multiplexer 31 directed by the configuration mechanism 321, as shown in FIG. 5(b). Then, the number of accumulative errors of the new designated delay path is continuously observed on whether it is larger than the threshold value. The aforesaid steps are followed again according to the observation. Whenever the number of accumulative errors is larger than the threshold value, all the delay chains 311-317 are scanned and their accumulative error numbers are recorded within a unit of time in order to have the renewed optimal delay path at the same time.

In addition to the aforesaid two states capable of triggering the operation of the configuration mechanism 321, a suitable triggering occasion can also be determined by a user command 325. For example, a user can define a rule that the delay circuit 30 scans all the delay chains 311-317 and records their accumulative error numbers during a unit of time after it runs for a certain amount of time. Therefore, all the delay chains 311-317 are periodically scanned no matter when the number of accumulative errors is larger than the threshold value. Of course, the user can define another rule or sequence to automatically scan and calibrate the delay circuit 30.

Figure 4:
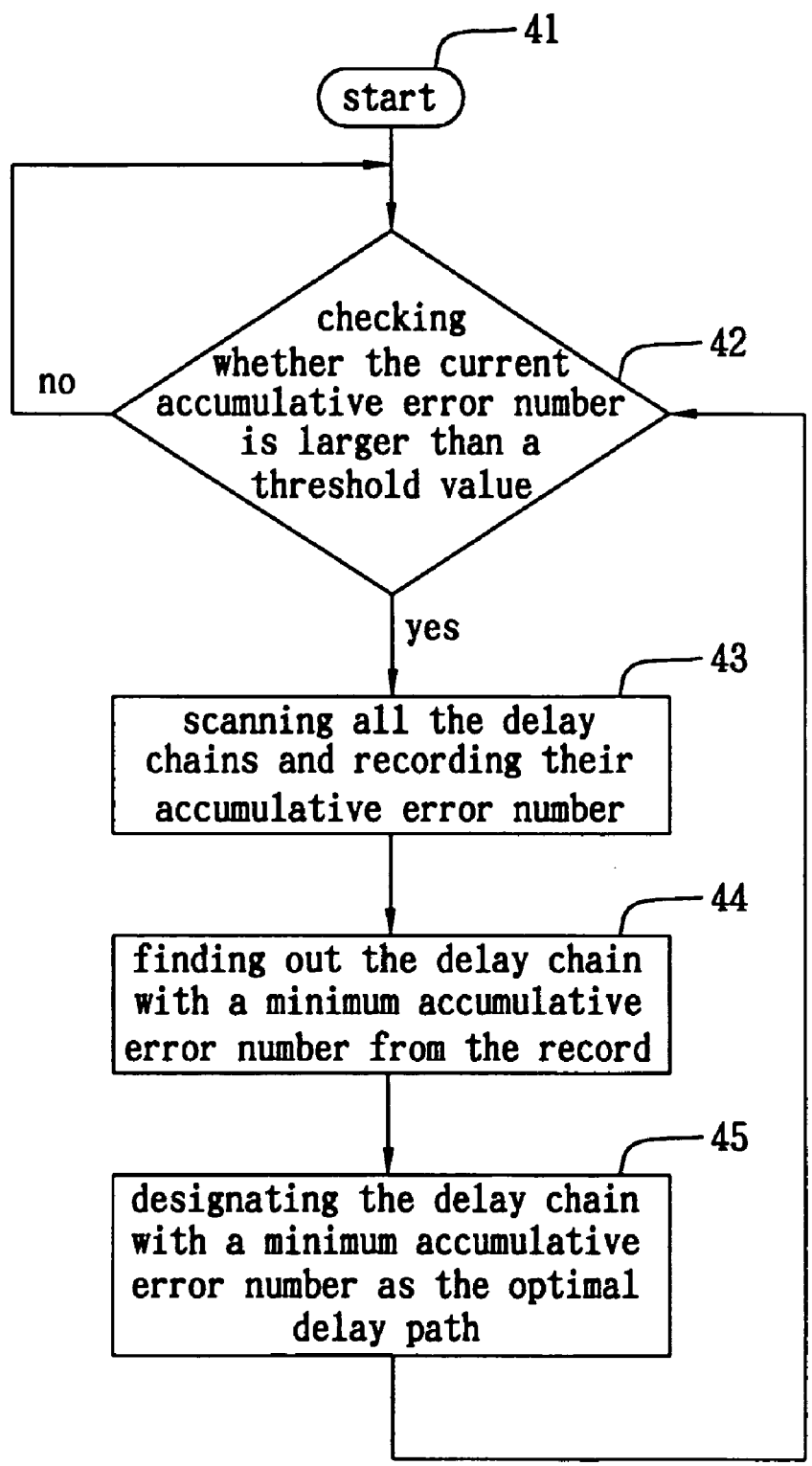
FIG. 4 is a flow chart of the delay circuit in an error detection state in accordance with the present invention.

FIG. 4 is a flow chart of the delay circuit in an error detection state in accordance with the present invention. Referring to the step 41, after the initial configuration is set, the delay circuit optimally designates the delay chain with a minimum accumulative error number as the delay path of output data. Within the step 42, the number of accumulative errors of the current delay path is continuously checked on whether it is larger than a predetermined threshold value. If the check requirement is satisfied, the delay circuit 30 still outputs data according to the initial configuration; reversely, the delay circuit scans all the delay chains and records their accumulative error numbers during a unit of time, as shown in the step 43. The delay chain with a minimum accumulative error number is found out by comparison according to the record of the number of accumulative errors, and is designated as the new delay path, as shown in the step 44 and step 45. Afterwards, the flowchart comes back to the step 42, and the number of accumulative errors of the current delay path is continuously checked on whether it is larger than the threshold value.

It is optimal to integrate the calibration circuit 32 and the delay circuit 30 into a chip. The calibration circuit 32 dynamically varies and designates the most suitable delay chain in response to the variation of its surrounding temperature and slice voltage. Therefore, the present invention provides a calibration method to meet the requirement of a high-speed electronic product.

The above-described embodiments of the present invention are intended to be illustrative only. Numerous alternative embodiments may be devised by persons skilled in the art without departing from the scope of the following claims.

What is claimed is:

1. An auto-calibration method for a delay circuit including a plurality of delay chains coupled to an input, comprising the steps of:

designating one of the delay chains as a delay path through which output data pass before the delay circuit is in use, wherein the delay chains are electrically coupled in parallel to the input such that the respective delay paths of the delay chains are electrically parallel to each other;

continuously detecting the delay circuit in use and calculating the number of accumulative errors of the designated delay chain within a unit of time;

scanning each of the delay chains and recording the number of accumulative errors of each of the delay chains within a unit of time if the number of accumulative errors of the designated delay chain is larger than a threshold value; and finding out and newly designating one of the delay chains with a minimum accumulative error number as the current delay path of the delay circuit.

2. The auto-calibration method for a delay circuit of claim 1, further comprising the step of:

holding the previously designated delay chain as a current delay path of the delay circuit if the number of accumulative errors of the previous designated delay chain is not larger than the threshold value.

3. The auto-calibration method for a delay circuit of claim 1, wherein a delay chain is designated before the delay circuit is in use according to the following steps:

scanning all the delay chains, recording the number of accumulative errors of all the delay chains within a unit of time; and finding out one of the delay chains with a minimum accumulative error number.

4. The auto-calibration method for a delay circuit of claim 1, further comprising the steps of:

periodically and automatically scanning all the delay chains, recording the number of accumulative errors of all the delay chains within a unit of time when the delay circuit is in use; and finding out one of the delay chains with a minimum accumulative error number.

5. The auto-calibration method for a delay circuit of claim 1, wherein a predetermined delay chain is selected as the delay path through which the output data pass when the delay circuit is reset.

6. The auto-calibration method for a delay circuit of claim 1, further comprising the steps of:

determining when/whether to start to scan all the delay chains, recording the number of accumulative errors of all the delay chains within a unit of time according to a user's command if the number of accumulative errors is less than the threshold value; and finding out one of the delay chains with a minimum accumulative error number.

7. The auto-calibration method for a delay circuit of claim 1, wherein the delay circuit periodically starts to scan all the delay chains and records the number of accumulative errors of all the delay chains within a unit of time.

8. An auto-calibration method for a delay circuit including a plurality of delay chains coupled to an input, comprising the steps of:

designating one of the delay chains as a delay path through which output data pass before the delay circuit is in use, wherein the delay chains are electrically coupled in parallel to the input such that the respective delay paths of the delay chains are electrically parallel to each other;

periodically starting to scan each of the delay chains, recording the number of accumulative errors of each of the delay chains within a unit of time;

finding out one of the delay chains with a minimum accumulative error number when the delay circuit is in use; and designating the delay chain with a minimum accumulative error number as the current delay path of the delay circuit.

9. The auto-calibration method for a delay circuit of claim 8, wherein a predetermined delay chain is selected as the delay path through which the output data pass when the delay circuit is reset.

10. The auto-calibration method for a delay circuit of claim 8, wherein a delay chain is designated before the delay circuit is in use according to the following steps:

scanning all the delay chains, recording the number of accumulative errors of all the delay chains within a unit of time; and finding out one of the delay chains with a minimum accumulative error number.

\* \* \* \* \*